US006208523B1

United States Patent
Bertolami et al.

(10) Patent No.: US 6,208,523 B1
(45) Date of Patent: Mar. 27, 2001

(54) PROCESSOR RETENTION APPARATUS

(75) Inventors: Gwen M. Bertolami, Menlo Park; Hoa Pham, San Jose, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/320,059

(22) Filed: May 26, 1999

(51) Int. Cl.[7] ....................................... H05K 7/14
(52) U.S. Cl. .................. 361/759; 361/686; 361/753; 361/759; 361/801; 361/802; 361/807; 211/41.17; 70/58; 24/544
(58) Field of Search .................... 361/686, 752, 361/756, 759, 760, 796, 801, 802, 807; 211/41.17; 70/58; 206/706, 707; 248/560; 24/542–544, 557

(56) References Cited

U.S. PATENT DOCUMENTS

| 5,162,979 | 11/1992 | Anzelone et al. .................... 361/415 |
| 5,708,563 | 1/1998 | Cranston, III et al. .............. 361/683 |
| 5,829,601 | 11/1998 | Yurchenco et al. ............... 211/41.17 |
| 5,831,821 | 11/1998 | Scholder et al. .................... 361/686 |
| 5,856,910 | 1/1999 | Yurchenco et al. .................. 361/704 |

OTHER PUBLICATIONS

HP NetServer E 60, LC 3, LH 3/3r, and LPr Processor Upgrade Installation Guide, pp. 1–33, Mar. 1999, Hewlett–Packard; HP Part No. 5969–0074.
Intel, "Mechanical Assembly and Customer Manufacturing Technology for S.E.C. Cartridge Processors" (Application Note); Jul. 1997; pp. 1–53.

*Primary Examiner*—Jayprakash N. Gandhi

(57) ABSTRACT

A processor retention assembly for housing multiple processor modules is herein disclosed. The processor retention assembly has a pair of lock levers, positioned on opposite sides of the processor module, that securely fastens each processor module to a connector on a circuit board and to the processor retention assembly. The lock levers ensure that the processor module is securely fastened to the connector and to the processor retention assembly so that the processor module and the circuit board are not damaged during mechanical shock and vibration. In addition, the lock levers eliminate the need for the processor module to contain any type of lock mechanism thereby allowing the processor retention assembly to house various types of devices, including those with lock mechanisms.

12 Claims, 15 Drawing Sheets

PROCESSOR RETENTION APPARATUS

FIELD OF THE INVENTION

The present invention relates generally to electronic systems. More particularly, the invention relates to a processor retention mechanism.

BACKGROUND OF THE INVENTION

A current trend in the microprocessor industry is the use of "slot" type processors. A slot type processor has a microprocessor core mounted onto a printed circuit board (PCB) having an edge finger connection. The board is inserted vertically into a slot type connector, such as the 242-pin slot one connector.

An example of such a processor is the Pentium II processor manufactured by the Intel Corporation. FIG. 1 illustrates a slot one type processor module 100 connected to a heat sink 102. This processor module 100 is otherwise known as a single edge contact (SEC) cartridge. The outer cover of the processor module 100 has two locking latches 104a–104b that are used to latch the processor module 100 to a retention frame.

FIGS. 2–3 illustrate the processor module 100 positioned in a retention frame 106 that is mounted to a PCB 108. FIG. 2 illustrates the assembled processor module 100 and heat sink 102 mounted with all its mechanical support structures. FIG. 3 shows each of the mechanical support structures used to position the processor module 100 onto the PCB 108. There is shown the processor module 100 positioned into a retention frame 106 that is mounted on a PCB 108 which surrounds a slot one connector 110. Four mounting holes 112a–112d are needed to attach the retention frame 106 to the PCB 108. The retention frame 106 allows the processor module 100 to be positioned in a vertical upright position. The locking latches 104 are used to latch the processor module 100 into the retention frame 106 so that the processor module 100 remains connected to the slot one connector 110 on the PCB 108.

A heat sink 102 is secured into a heat sink support structure 114, 116 in order to minimize damage to the PCB 108 or the electronic components mounted thereon during mechanical shock and vibration. The heat sink support structure includes a heat sink support base 114 and a heat sink support top bar 116. The bottom portion of the heat sink 102 is positioned between the heat sink support base 114 and the heat sink support top bar 116. The heat sink support structure 114, 116 is mounted onto the PCB 108 with two additional mounting holes 118a–118b.

The placement of the processor module 100 into the retention frame 106 consists of two main actions. First, the processor module 100 is inserted in a downward direction into the retention frame 106 and the slot one connector 110. Next, the heat sink 102 is slid into the heat sink support structure so that the bottom portion of the heat sink 102 is positioned between the heat sink support base 114 and the heat sink support top bar 116.

This type of a mechanical support structure has several disadvantages. It is a costly device since it consists of several parts including the retention frame 106, the heat sink support base 114, and the heat sink support top bar 116. In addition, assembly of the device onto the PCB requires the additional step of securing the heat sink to the heat sink support structure.

Furthermore, the mechanical support structure requires six mounting holes 112a–d, 118a–118b to mount each processor module 100. In the event where multiple processor modules 100 are mounted onto the same PCB 108, a considerable amount of space is used for the mounting holes which may not be available on the PCB 108.

Additionally, the retention frame is dependent on the locking latches positioned on the processor module in order to secure it into the slot one connector. As such, the retention frame does not have a mechanism for securing the processor module to the connector and relies on the locking latches that are part of the processor module. In addition, the retention frame cannot support processor modules that do not have locking latches. Accordingly, there is a need for a processor retention device that overcomes these problems.

SUMMARY OF THE INVENTION

The present invention pertains to a circuit board retention assembly that can house one or more circuit boards mounted to a connector. In a first embodiment, the present invention pertains to a processor retention assembly that can house one or more processor modules having an edge finger connection. The processor retention assembly is positioned on a PCB surrounding one or more slot type connectors. The processor retention assembly is used to support the processor modules that are vertically mounted into the slot type connectors.

The processor retention assembly includes a rectangular-like cage having two parallel side panels. Each side panel has a set of processor rails that are used to house a processor module. There are two processor rails for each processor module and they are positioned on each side panel such that each edge of the processor module fits into a respective processor rail. Each edge of the processor module is slid along a respective processor rail and inserted into a slot connector.

The processor module is then securely fastened to the cage by means of two lock levers. There are two such lock levers for each processor module. The lock levers are positioned on opposite sides of the processor module and along the respective processor rails. The lock levers are used to securely fasten a processor module into the connector on the PCB and to securely fasten the processor module to the cage. In this manner, the processor module can withstand mechanical shock and vibration and avoid considerable damage to the processor module, the PCB, and the electronic components mounted thereon.

Each lock lever can be positioned in either the lock position or in the release position. In the lock position, the processor module is mounted into the slot connector and secured to the processor retention assembly. In the release position, the processor module is ejected from the slot one connector and released from the processor retention assembly.

Each lock lever has an ejector handle, a handle lock, and an ejector lever. The ejector handle allows a user to easily maneuver the lock lever into the lock or release position. The handle lock is the locking mechanism that secures the processor module to the processor retention assembly. The ejector lever is placed at the bottom of the processor module and is used to eject the processor module from the slot one connector and from the processor retention assembly.

The lock levers are beneficial since they provide a retention mechanism that can securely fasten any type of processor module to the processor retention assembly. The lock levers alleviate the need for the processor module to have such a retention mechanism. As such, the processor retention mechanism is not dependent on the processor module having a retention mechanism and can be used to house various types of processor modules or edge finger connection devices, including those having a locking mechanism.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 4:
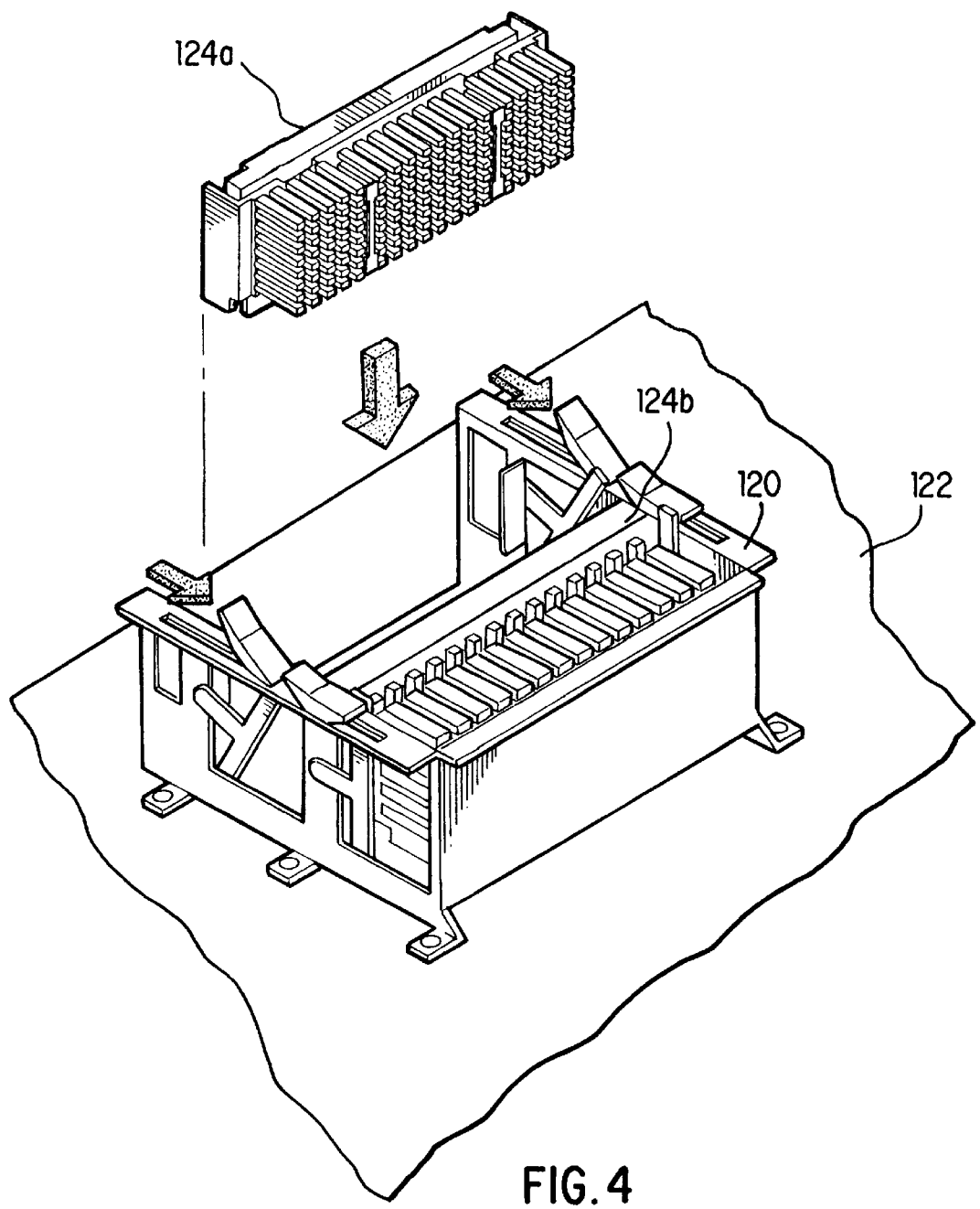
FIG. 4 is an isometric view of a processor module mounted onto a PCB through the processor retention assembly in accordance with an embodiment of the present invention.

FIG. 4 illustrates a processor retention assembly 120 mounted onto a PCB 122. The processor retention assembly 120 houses two processor modules 124a–124b positioned into two slot one connectors that are mounted onto the PCB 122. The processor retention assembly 120 is used to secure each processor module 124 onto the PCB 122 in order to ensure that the connection between the processor modules 124 and the PCB 122 is stable. In addition, the processor retention assembly 120 ensures that the PCB 122 can survive mechanical shock and vibration such that there is minimal board deflection and damage to the electronic devices mounted thereon.

The processor retention assembly 120 is used to house circuit boards that are mounted to connectors. One such type of circuit board has an edge finger connection that is mounted into a slot one connector. However, it should be noted that the present invention is not constrained to any particular type of circuit board or connector. FIGS. 1, 5–7 illustrate three such circuit boards.

Figure 1:
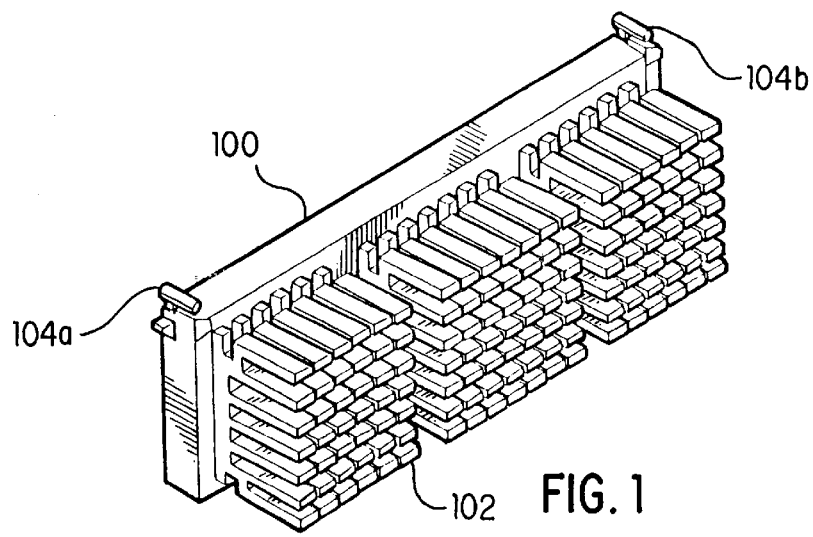
FIG. 1 is a schematic view of an exemplary processor module having locking latches.

Referring to FIG. 1, there is shown a processor module 100 otherwise known as a single edge contact (SEC) cartridge. The SEC processor module 100 is wholly enclosed with a cartridge cover. A heat sink 102 is attached to the processor module 100. The cover of the processor module 100 has two lock levers 104a–104b that are used to latch the processor module 100 to a processor retention mechanism. However, the lock levers are not used to secure the processor module to the processor retention assembly 120 of the present invention.

Figure 5:
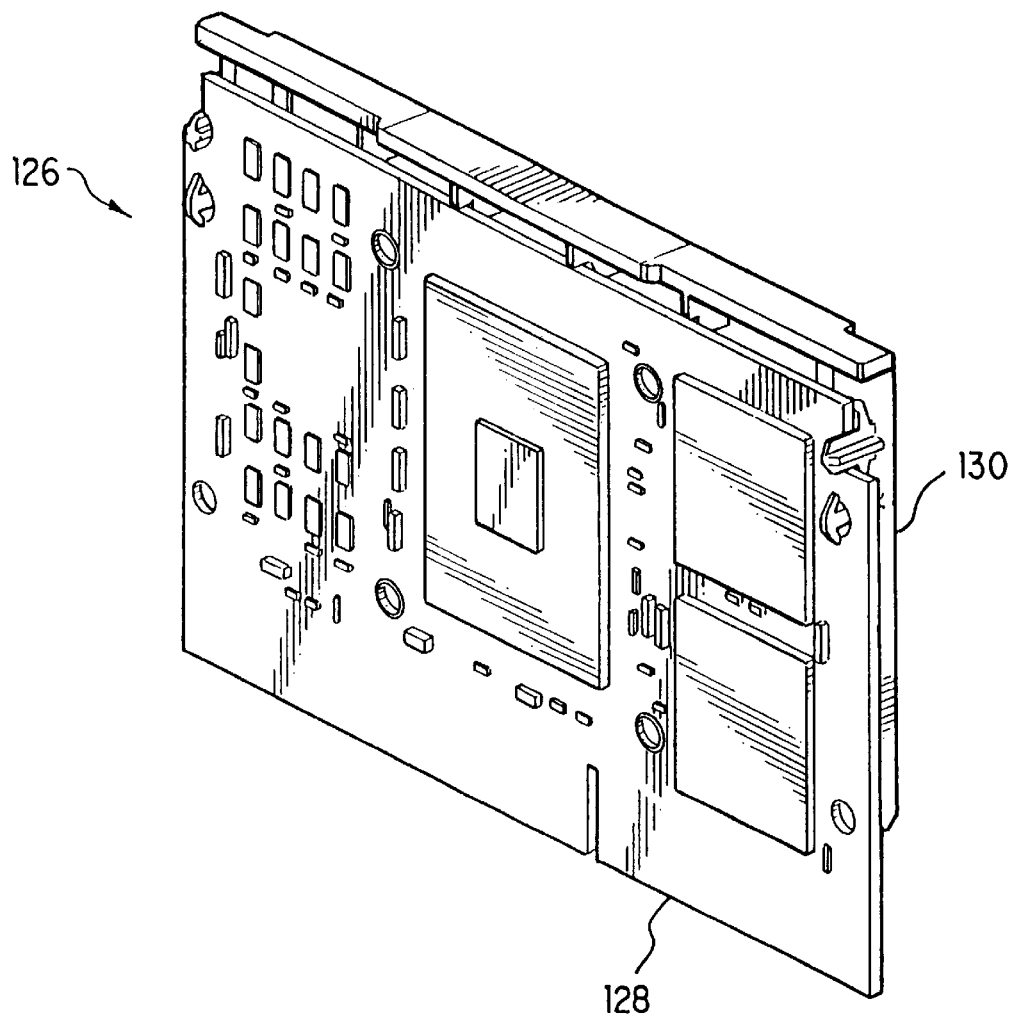
FIG. 5 illustrates a single edge contact cartridge.

FIG. 5 illustrates another processor module 126 otherwise known as a single edge contact cartridge 2 (SECC2) which is manufactured by the Intel Corporation. The SECC2 processor module 126 differs from the SEC processor module 100 in that the SECC2 processor module 126 is not fully enclosed with a cartridge cover. The SECC2 126 includes a single PCB 128 that is covered on one side with a black plastic cover 130. There is no cover on the front side of the SECC2 processor module 126 as there was for the SEC processor module 100. In addition, the SECC2 processor module 100 has no locking latches.

A more detailed discussion of the SECC2 can be found in Intel Corporation, Single Edge Contact Connector 2 (S.E.C.C.2) Thermal Interface Material Functional Requirements, Order No: 244458-001, November 1998; Intel Corporation, Single Edge Contact Cartridge 2 (S.E.C.C.2) Heat Sink Attachment and Heat Sink Functional Requirements Order Number: 244456-001, Nov. 23, 1998; and Intel Corporation, S.E.C.C.2 Heat Sink Installation and Removal Process, Order Number 244454-001, December 1998 which are hereby incorporated by reference as background information.

Figure 6:
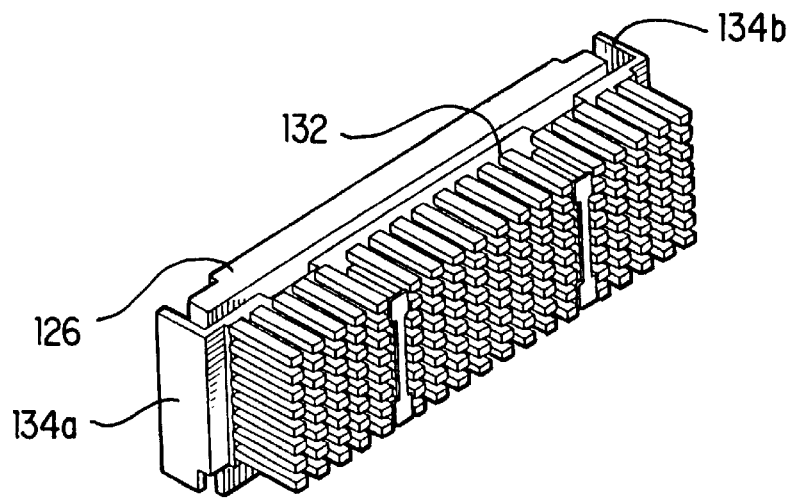
FIG. 6 is schematic view of a processor module that does not contain locking latches.

FIG. 6 shows a heat sink 132 attached to the SECC2 processor module 126. The heat sink 132 contains two rail guides 134a–134b that cover the outer edges of the processor module 126. The rail guides 134 are used to slide the SECC2 processor module 126 into the same processor retention assembly 120 that houses a SEC processor module 126. However, the SECC2 processor module 126 can be positioned into the processor retention assembly 120 with or without an attached heat sink 132.

Figure 7:
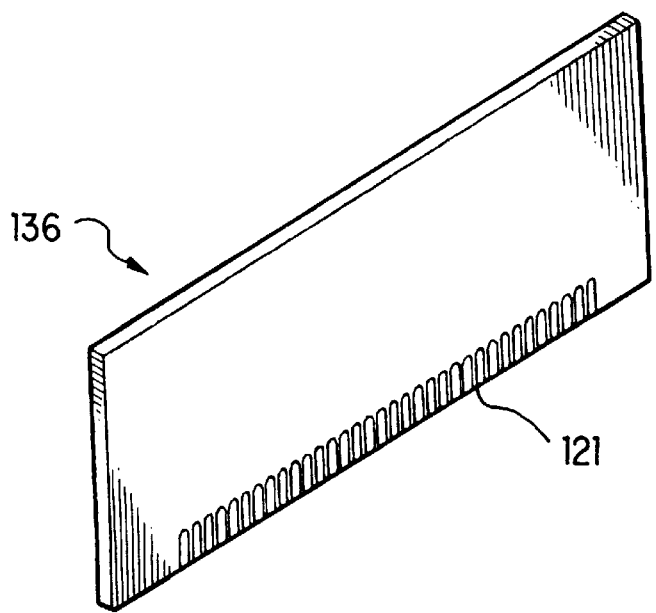
FIG. 7 illustrates a terminator PCB in accordance with an embodiment of the present invention.

FIG. 7 illustrates a terminator PCB 136 that can be mounted into the processor retention assembly 120. The terminator PCB 136 is a terminator resistor module having an edge finger connection 121. The outer edges of the PCB slide into the processor retention assembly 120 so that the edge finger connection 121 mounts into a slot one connector.

Figure 8:
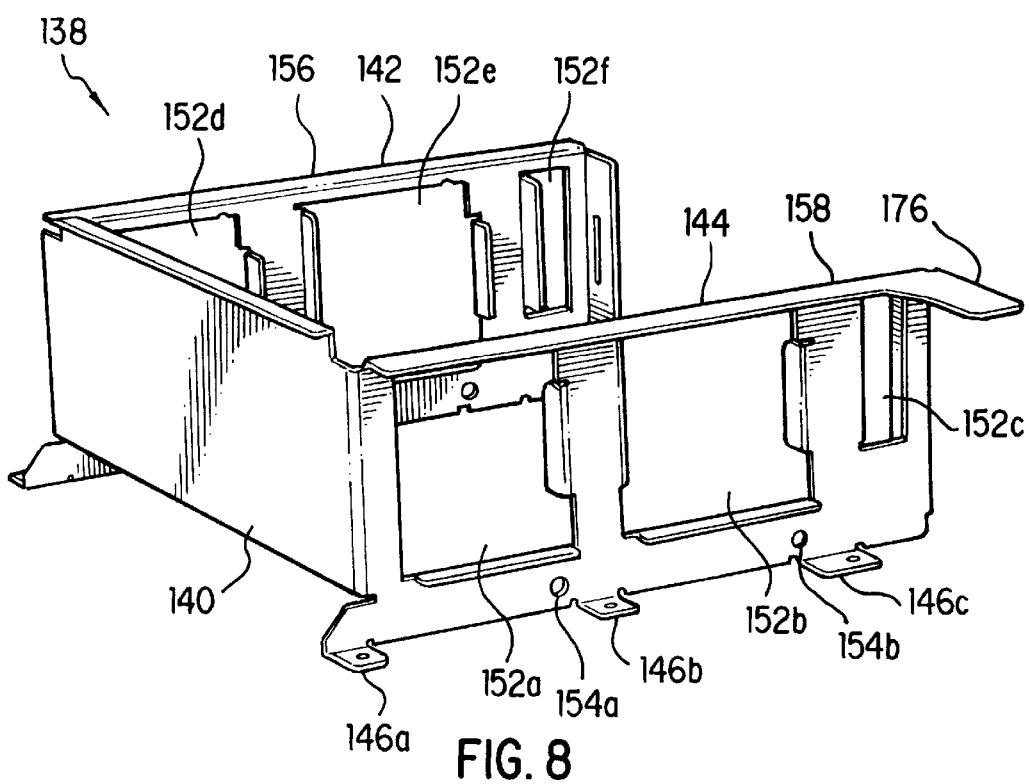
FIGS. 8–10 illustrates the cage of the processor retention assembly in accordance with an embodiment of the present invention.

FIG. 8 illustrates the frame 138 of the processor retention assembly 120 that is capable of housing either a processor module 100, 126 a terminator PCBs 136, any edge finger connection device, or any combination thereof. There is shown a rectangular-shaped frame or cage 138 having a front upstanding wall or panel 140 and two side upstanding walls or panels 142, 144. The front panel 140 maintains the stability of the two side panels 142, 144, especially during shock and vibration. The two side panels 142, 144 provide the requisite mechanical support features for mounting and securing a processor module 100, 126 into a slot one connector and for securing the processor retention assembly to a PCB. The cage 138 is fabricated as a single unit and is made of sheet metal such as thin steel or aluminum.

Figure 9:
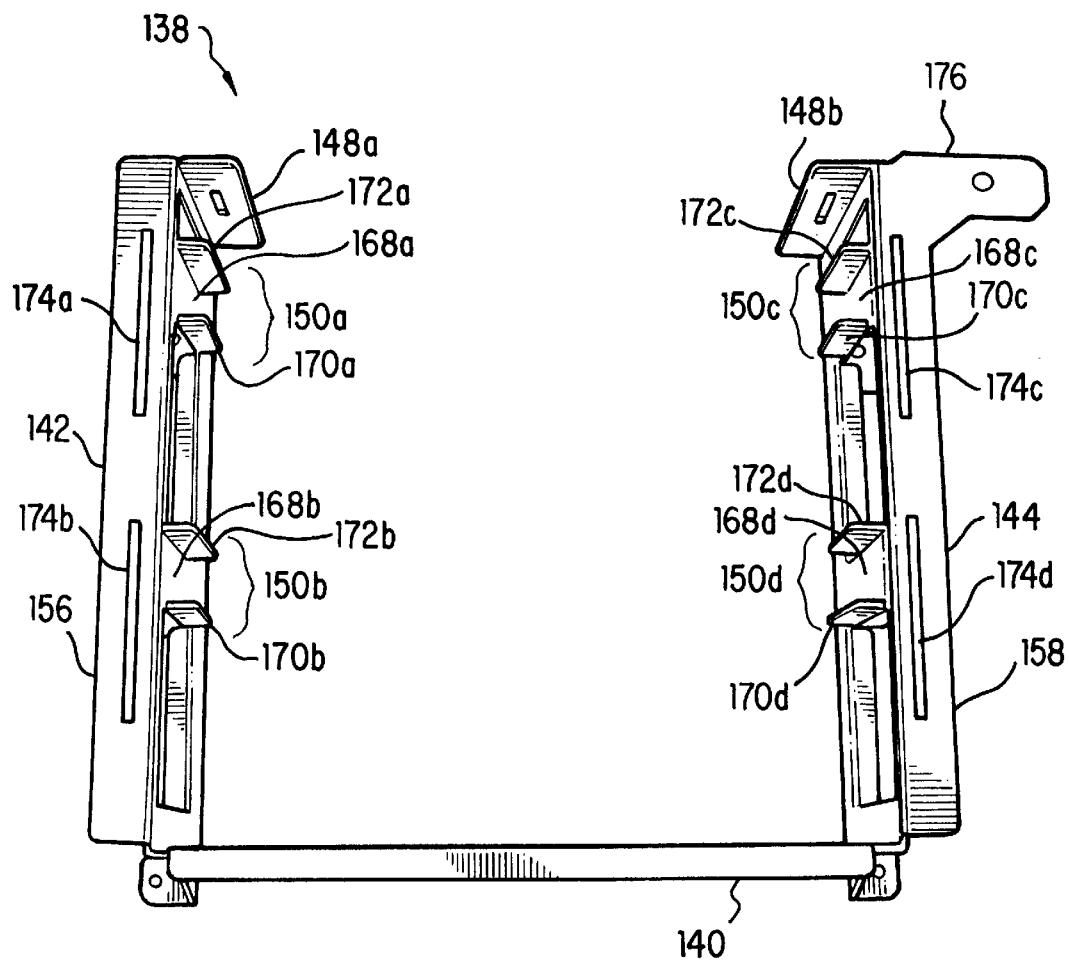
Figure 10:
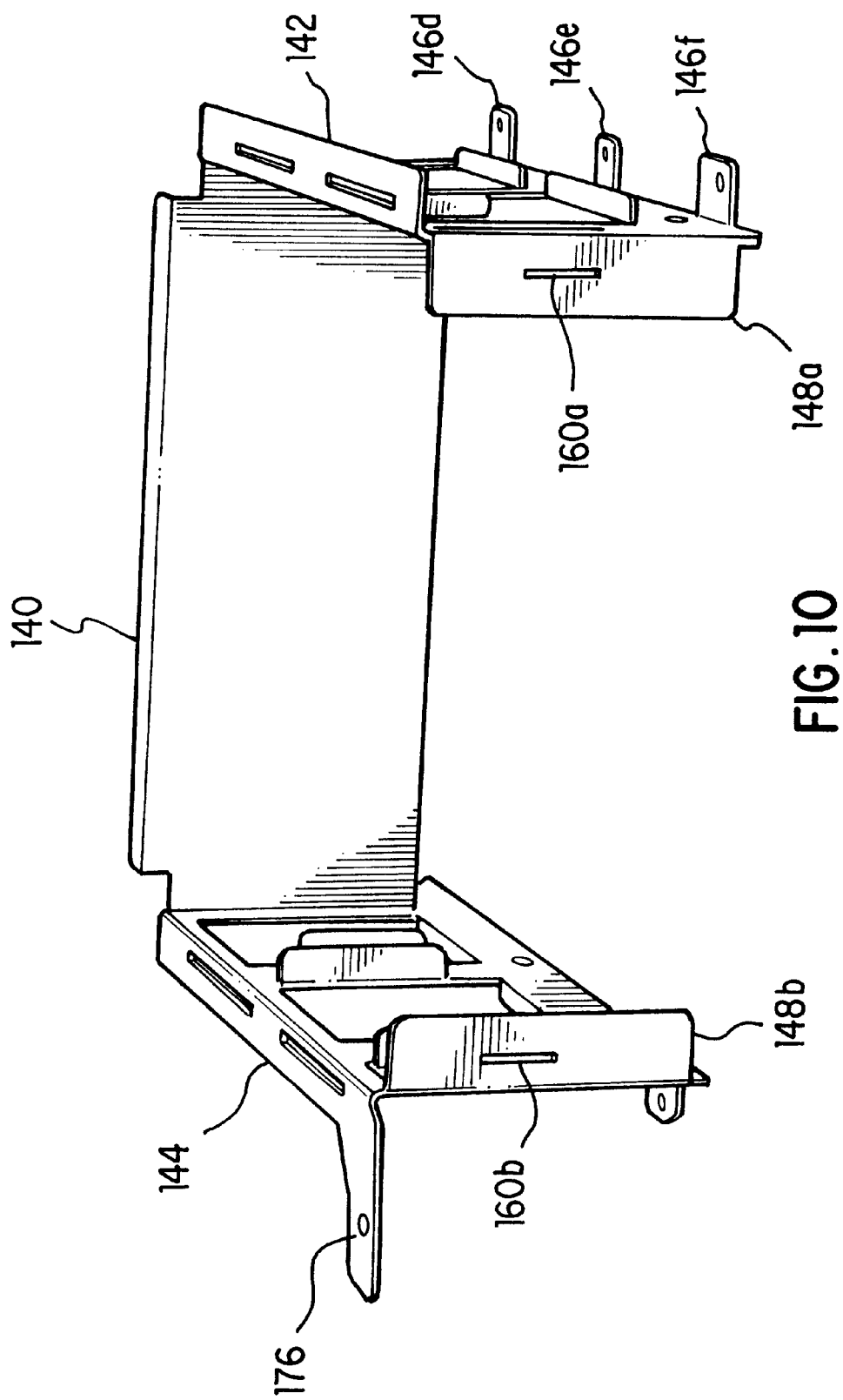

As shown in FIGS. 8–10, each side panel 142, 144 has three mounting feet 146a–146c, a mounting flange 148a–148b, processor rails 150a–150d, ventilation apertures 152a–152f, pivot pin holes 154a–154b, and a guide rail 156, 158.

On the bottom side of each side panel 142, 144, there are three mounting feet 146a–146f. The mounting feet 146 allow the cage 138 to be detachably mounted to a PCB. The mounting feet 146 are spaced apart from each other such that they balance the cage 138 when it is placed onto a PCB. When the cage 138 is positioned onto the PCB, the mounting feet 146 are positioned so that they do not touch any underlying electronic components. As shown in this embodiment, there are a total of six such mounting feet 146 needed to mount two processor modules 100, 126 to a PCB. Each mounting foot 146 includes an aperture that is used to fit a fastener or other such device so that the cage 138 is secured to a PCB.

Figure 11:
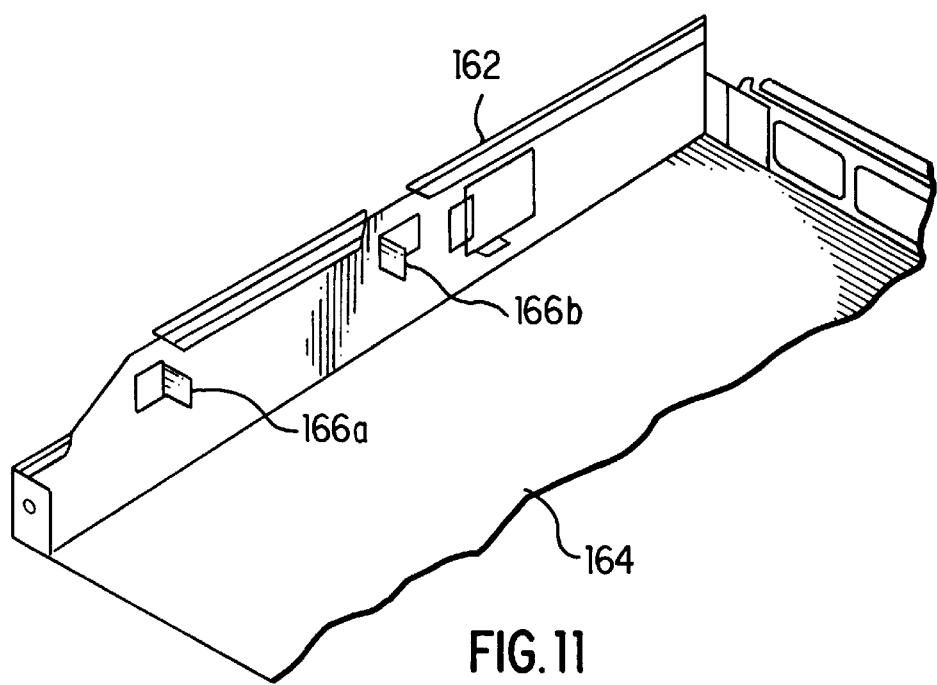
FIG. 11 is an isometric view of a PCB having a rear panel in accordance with an embodiment of the present invention.

A mounting flange 148 is positioned on the interior side of each side panel 142, 144. The mounting flanges 148 allow the three-panel cage 138 to be mounted to a rear upstanding wall or panel. Each mounting flange 148 includes a slot 160 that is used to secure the processor cage 138 to the rear panel. FIG. 11 shows a rear panel 162 that is attached to the rear edge of a PCB 164. The rear edge 162 of the PCB 164 is opposite the edge of the PCB 164 having the edge finger connection. There is shown two mounting tabs 166a–166b. The mounting flanges 148 of each side panel 142, 144 is fit into a corresponding mounting tab 166 thereby securing the cage 138 to the PCB 164.

The processor rails 150a–150d are used to position and secure a processor module to a slot one connector. The processor rails 150 are positioned on the interior side of each side panel 142, 144 and include a channel 168 formed from two side flanges 170, 172. The outer side of each processor module is placed into a channel 168 and moved in a downward direction so that the edge finger connection fits into a slot one connector. The two side flanges 170, 172 that surround the channel 168 enable the processor module to slide comfortably into the channel 168 and hence into the slot one connector.

The ventilation apertures 152a–152f are used to enable a flow of air around a processor module. In an embodiment of the present invention, the processor modules can employ Pentium II or III processors operating at processor speeds that exceed 450 MHz. Due to the high frequency ranges of these processors, adequate cooling is needed in order to ensure that the heat produced from the operation of these processor modules does not damage the processor module or the electronic components in close proximity to these modules.

A pivot point hole 154 is positioned on the bottom side of each side panel 142, 144 and in close proximity to a processor rail 150. The pivot point hole 154 is used to support a lock lever which will be described in more detail below.

The top portion of each side panel 142, 144 has a guide rail 156, 158. Each guide rail 156, 158 has guide slots 174 which are used by the lock levers. The use of the guide slots 174 will be described in more detail below.

In addition, the right side panel 144 has an additional mounting flange 176 which is used to fasten the processor retention assembly 120 to the rear panel 162. The rear panel 162, in essence, becomes the fourth wall of the processor retention assembly 120 and contributes to the stability of the processor retention assembly 120. It should be noted that the mounting flange 176 is not a limitation to the processor retention assembly 120 and in alternate embodiments, the flange need not be present.

Figure 12:
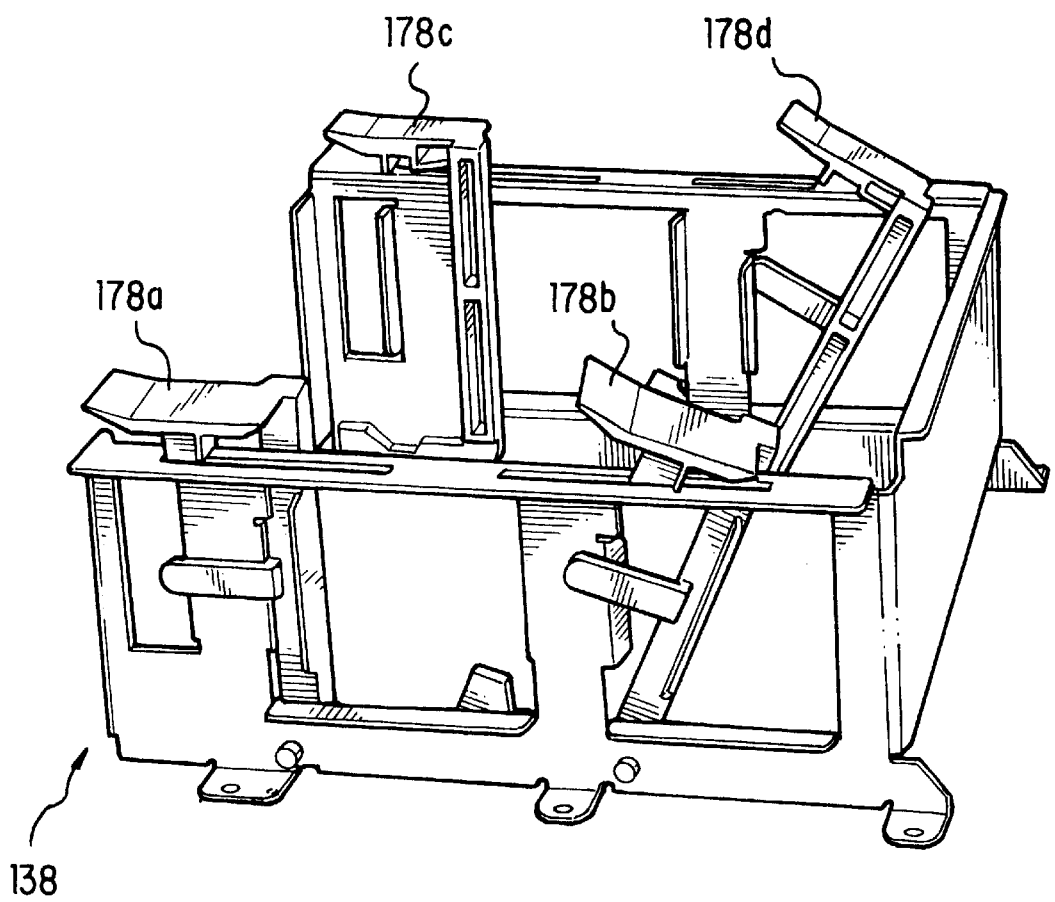
FIG. 12 is an isometric view of the cage of the processor retention assembly containing the lock levers in accordance with an embodiment of the present invention.
Figure 13:
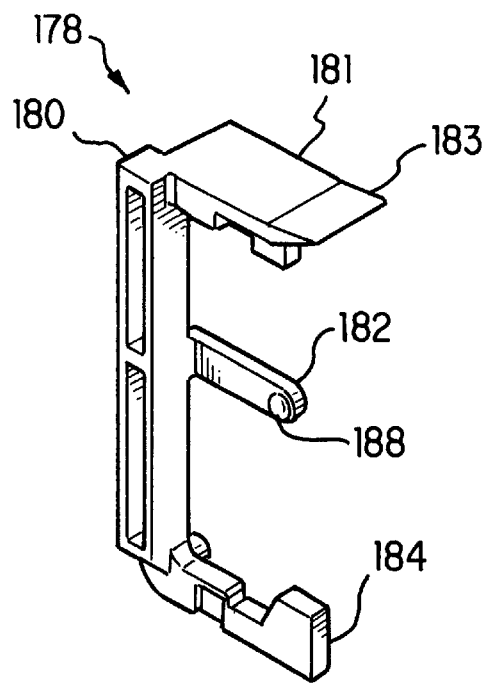
FIGS. 13–14 are interior side views of the lock levers in accordance with an embodiment of the present invention.
Figure 14:
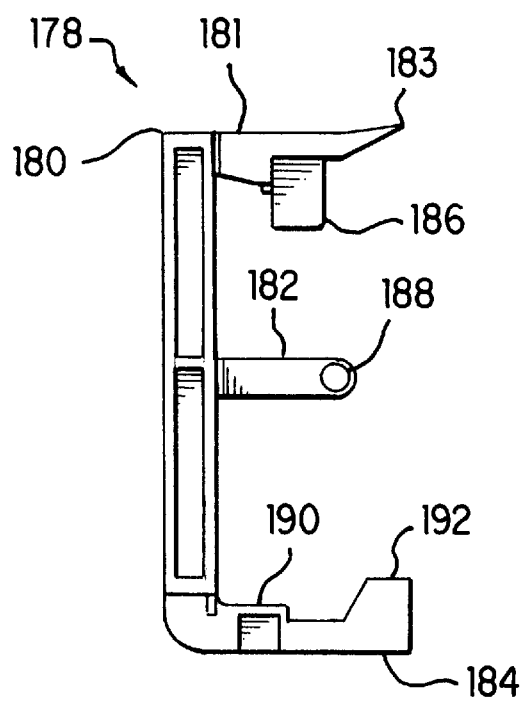
Figure 15:
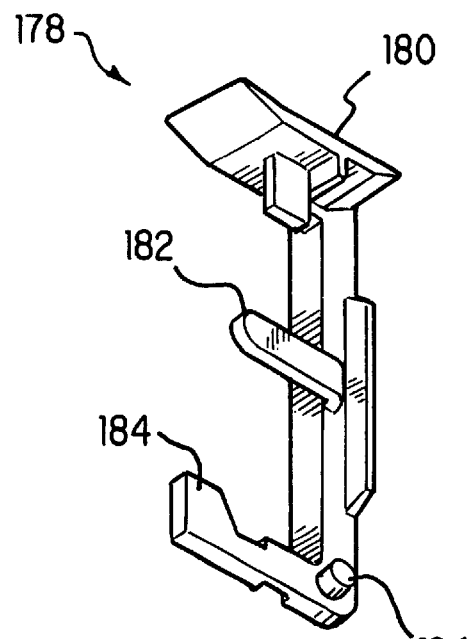
FIGS. 15–16 are exterior side views of the lock levers in accordance with an embodiment of the present invention.
Figure 16:
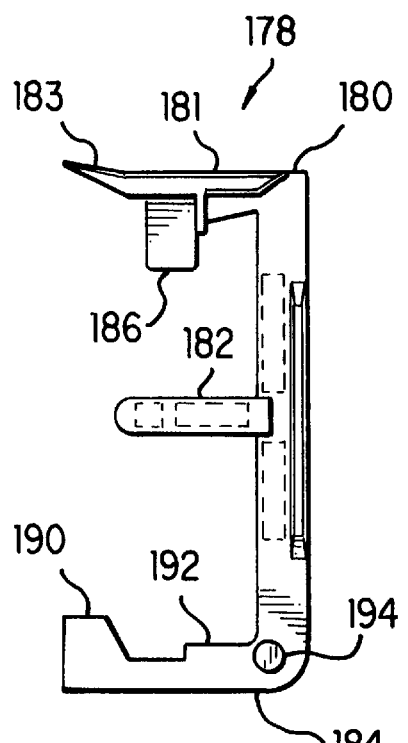

FIG. 12 illustrates the cage 138 assembled with lock levers 178a–178d. The lock levers 178 are used to securely retain the processor modules into the processor retention assembly 120. There are two lock levers 178 for each processor module. Preferably, the lock levers 178 are fabricated of a plastic material, such as polycarbonate plastic.

FIGS. 12–16 illustrate a lock lever 178. The lock lever 178 has an ejector handle 180, a handle lock 182, and an ejector lever 184. The ejector handle 180 is used to position the lock lever 178 in either the lock or release position. In the lock position, the processor module is secured to the slot one connector and to the cage 138. In the release position, the processor module is released or ejected from the slot one connector and the cage. As shown in FIG. 12, lock levers 178a, 178c are positioned in the lock position and lock levers 178b, 178d are positioned in the release or eject position.

The top surface of the ejector handle 180 includes a flat planar surface 181 connected to a slightly elevated second planar surface 183. The second planar surface 183 is raised at approximately a ten degree angle above the flat planar surface 181 so that a user can easily manipulate the ejector handle 180 with minimal force.

In addition, the ejector handle 180 has a guide 186 that is used to ensure that the lock lever 178 remains positioned in the cage 138 especially when force is applied to the lock lever 178. The guide 186 is positioned on the bottom surface of the ejector handle and slides along the guide slot 174. As shown in FIG. 12, the guide 186 remains in the guide slot 174 when moved to either the lock or eject positions.

The handle lock 182 is used to securely fasten the processor module to the cage 138. This is important especially when the PCB 122 undergoes mechanical shock and vibration testing. At the outer edge of the interior side of the handle lock 182, there is a ball joint 188. When the lock lever 178 is placed in the lock position, the handle lock 182 slides along the exterior side of a processor rail 150 to the opposite side. The ball joint 188 snaps into place on the opposite side of the processor rail 150. When the lock lever 178 is released, the ball joint 188 slides along the exterior side of the processor rail to the other side of the processor rail 150.

The ejector lever 184 is used to lift or eject the processor module out of the slot one connector. As such, the ejector lever 184 is positioned so that it is under the bottom surface of the processor module when the processor module is fitted in the slot one connector. The ejector lever 184 has a base element 190 connected to a hook latch 192. The base element 190 supports the bottom of the processor module and the hook latch 192 ensures that the processor module is securely fastened to and stable within the processor retention assembly 120. In addition, the ejector lever 184 has a pivot pin 194 that fits into the pivot pin hole 154 on the cage 138. The pivot pin 194 enables the lock lever 178 to rotate between the lock and release positions.

Each lock lever 178 is snapped into the cage 138 thereby eliminating the need for additional fasteners or screws to secure the levers 178 onto the cage 138. The lock lever 178 snaps onto the cage 138 by placing the pivot pin 194 in the pivot pin hole 154, the guide 186 in the guide slot 174, and the handle lock 182 on the exterior side of the processor rail 150.

FIGS. 4, 17–19 illustrate the operation of the processor retention assembly 120. First, the lock levers 178 need to be placed in the open or release position. This occurs by moving the lock levers 178 forward along the guide slot 174 in the guide rail 156, 158 towards the front panel 140 as shown in FIGS. 4, 19A and 19B.

Figure 18A:
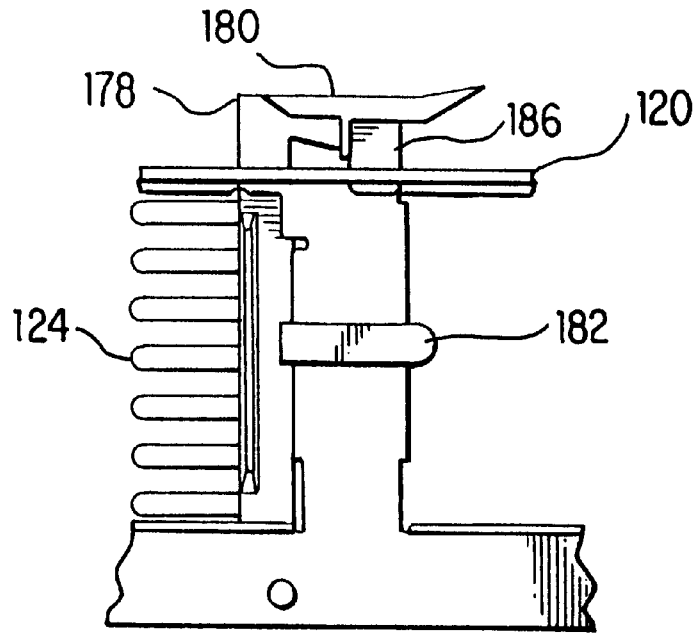
FIGS. 18A–18B are side views of the lock levers in the locked position in accordance with an embodiment of the present invention.
Figure 18B:
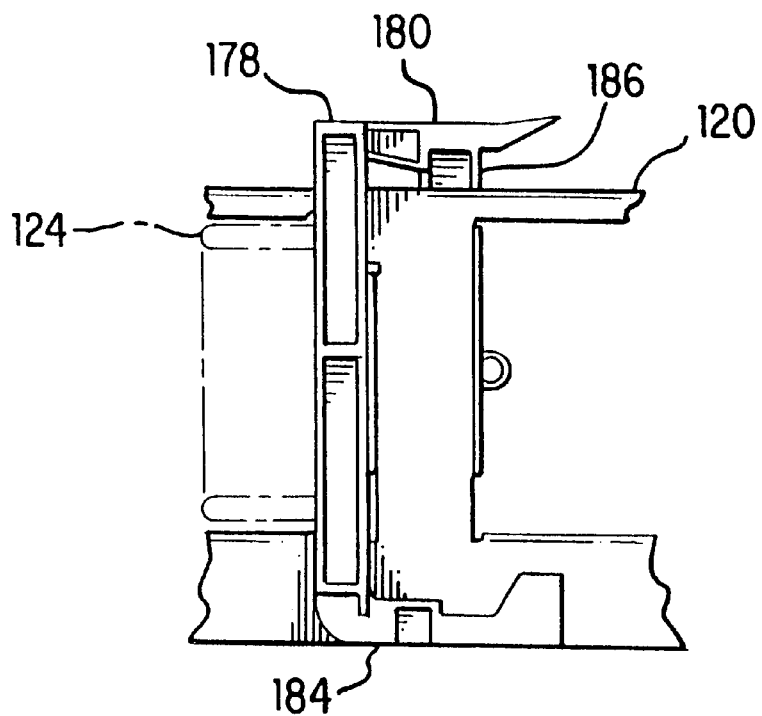

Once the lock levers 178 are in the release position, the processor module 100, 126 is inserted into the processor retention assembly 120 as follows. As shown in FIG. 4, each outer edge of a processor module 100, 126 is placed in a respective channel 168, slid in a downward direction, and fitted into the slot one connector. The force from inserting the processor module 100, 126 into the processor retention assembly 120 automatically pushes the lock levers 178 into the lock position. As shown in FIGS. 18A and 18B, the ejector handle 180 slides along the guide slot 174 in a direction that is away from the front panel 140 and the handle lock 182 snaps over the exterior side of the processor rail 150 thereby locking the processor module 100, 126 into the processor retention assembly 120.

Figure 17:
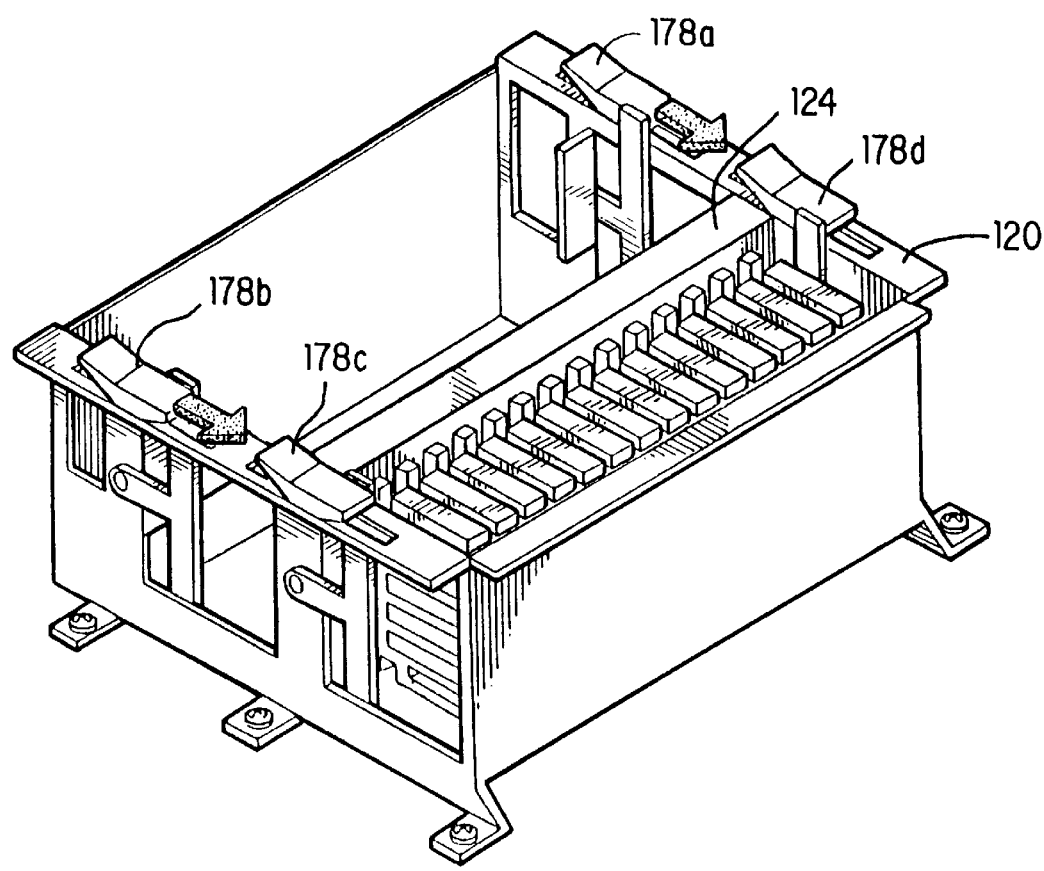
FIG. 17 illustrates the manner in which a PCB is removed from the processor retention assembly in accordance with an embodiment of the present invention.
Figure 19A:
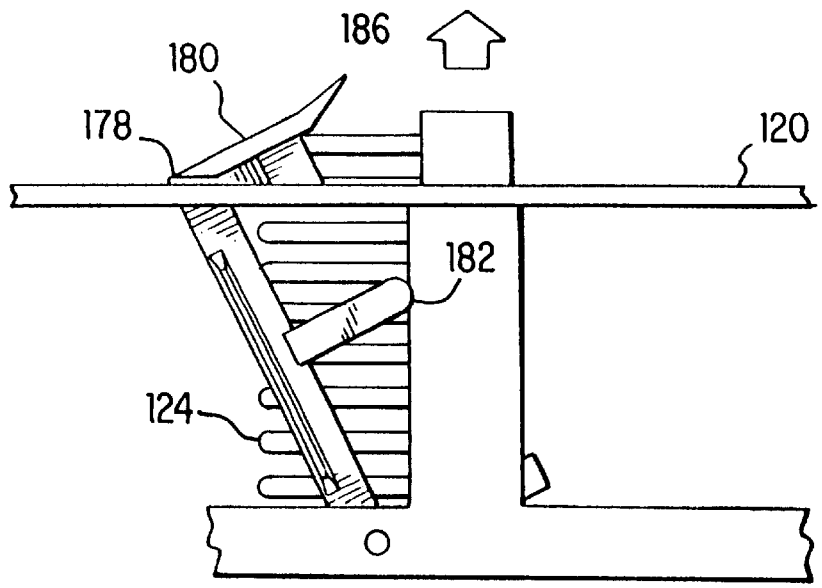
FIGS. 19A–19B are side views of the lock levers in the release position in accordance with an embodiment of the present invention.
Figure 19B:
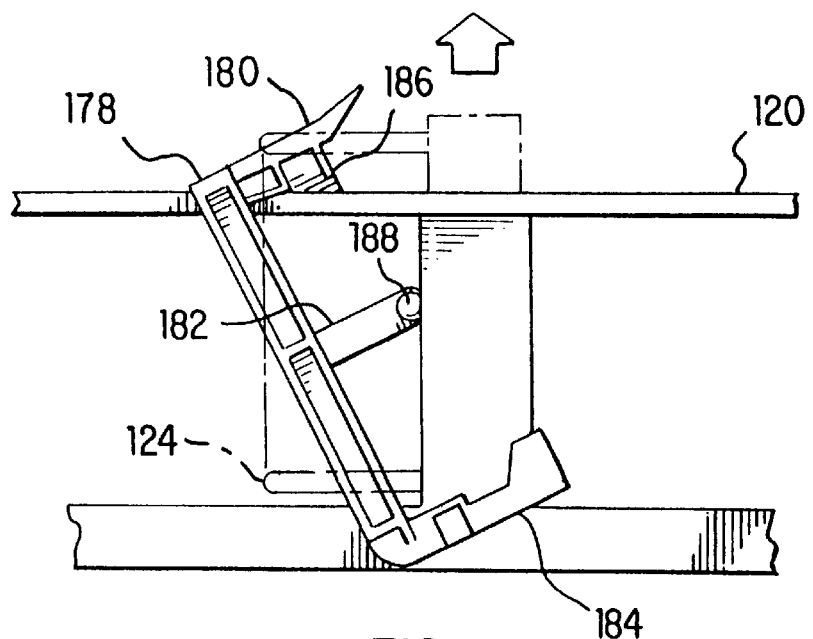

As shown in FIGS. 17, 19A–19B, to remove a processor module 100, 126 from the processor retention assembly 120, both ejector handles 180 are moved forward in the guide slot 174 towards the front panel 140 and the force exerted on the ejector handles automatically ejects the processor module 100, 126 from the processor retention assembly 120. The ejector levers 184 lift in an upward direction thereby ejecting the processor module 100, 126 in an upward direction along the channel 168 and up and out of the cage 138.

Figure 2:
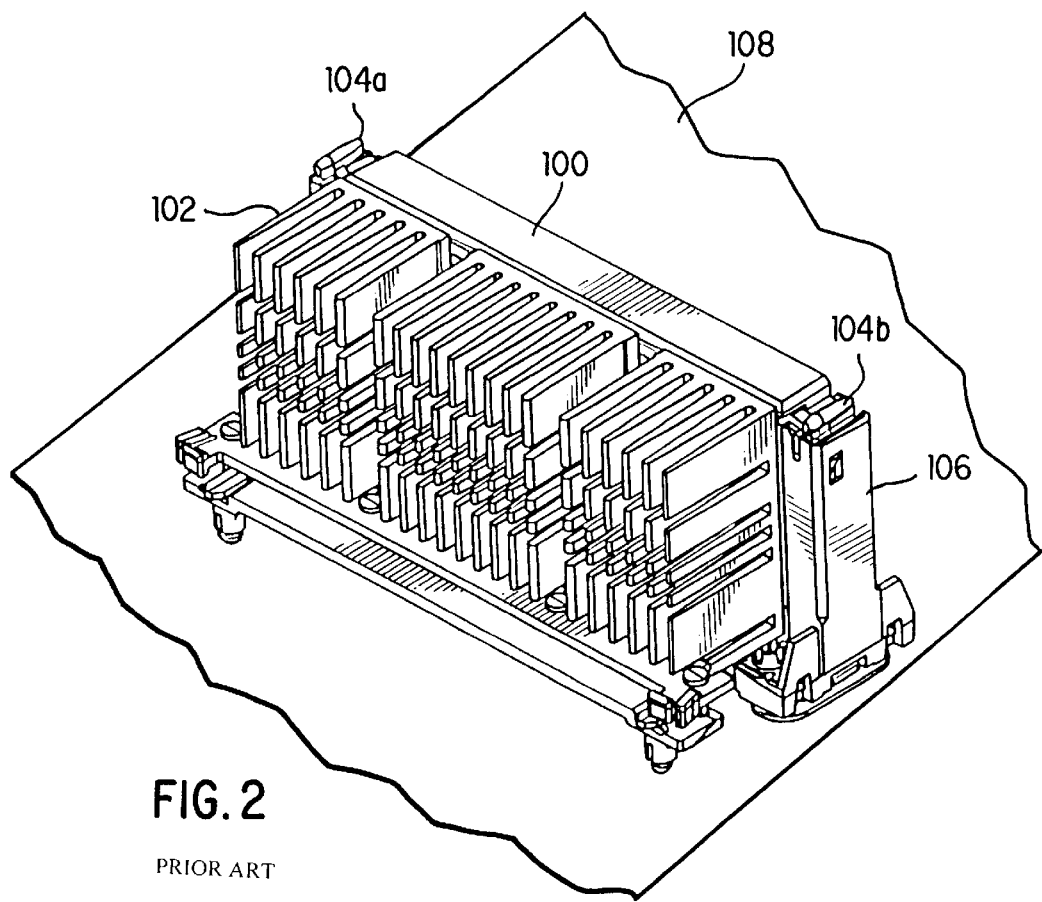
FIG. 2 illustrates the processor module shown in FIG. 1 positioned in a retention frame that is mounted onto a PCB.
Figure 3:
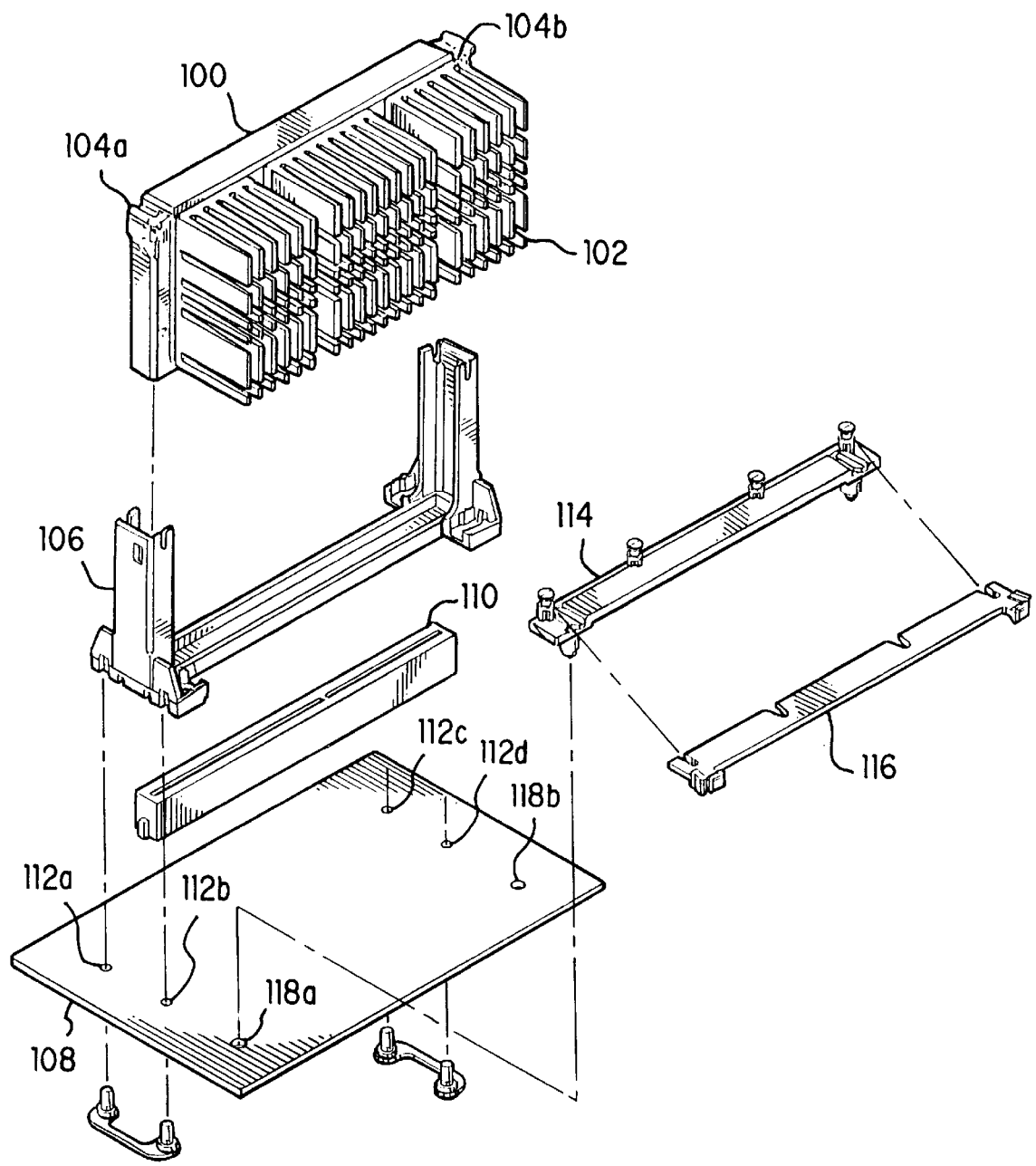
FIG. 3 is an exploded view of the processor module and the mechanical support structures that are used to mount the processor module onto the PCB.

The foregoing description has described a processor retention assembly that is beneficial over the prior art. The processor retention assembly consists of less parts thereby making it more economical to manufacture and sell. For the purpose of securing the processor modules to the PCB, the processor retention assembly includes a frame, two pairs of lock levers, and six mounting fasteners. This is an improvement over the prior art described in FIGS. 2–3 which requires a retention frame, a heat sink support, and six mounting fasteners, all to mount just one processor module to a PCB. The assembly described herein does not need a separate heat sink support and requires six mounting fasteners to mount two processor modules to the PCB. The structure of the cage described herein is able to secure the processor module to the PCB under shock and vibration without the need for a heat sink support. The elimination of the additional mounting fasteners is beneficial since it conserves the amount of board space needed for mounting the processor retention assembly.

The lock levers are beneficial over the prior art since they securely fasten the processor module to the slot one connector and the PCB without requiring any retention features on the processor module itself. Furthermore, the lock levers contain a lock mechanism that provides an added retention support to the cage thereby alleviating the need for an additional retention structure, such as the heat sink support in the prior art.

In addition to the processor retention assembly consisting of less parts, the cage structure of the processor retention assembly allows there to be less circuit board deflection thereby minimizing or eliminating stress to the components attached to it.

Furthermore, the design of the processor retention assembly is amenable to any type of processor module including those having locking mechanisms, such as the SEC and SECC2 processor modules. This makes the processor retention assembly independent of any particular processor module packaging and provides the underlying computer system with the capability to utilize any combination of single edge connection processors or edge finger connection devices.

The foregoing description, for purposes of explanation, used specific nomenclature to provide a thorough understanding of the invention. However, it will be apparent to one skilled in the art that the specific details are not required in order to practice the invention. In other instances, well known structures and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In particular, one skilled in the art can easily modify the processor retention assembly described above to accommodate any number of processor modules, that being one processor module or more than two processor modules. Although the present invention has been described with reference to edge finger connection PCBs, the technology of the present invention is amenable to retain any type of circuit board that can be mounted through any type of connector onto another circuit board.

What is claimed is:

1. A processor retention assembly, comprising:
    a cage housing a first edge finger connection device having a first edge and a second edge, the cage having a first wall and a second wall;
    the first wall having a first rail housing the first edge of the first device;
    the second wall having a second rail housing the second edge of the first device;
    a first lever pivotally coupled to the first rail, the first lever enables the first edge of the first device to slide in and out of the first rail;
    a second lever pivotally coupled to the second rail, the second lever enables the second edge of the first device to slide in and out of the second rail;
    the first lever having a first lock mechanism; and
    the second lever having a second lock mechanism;
    wherein the first and second lock mechanisms secure the first device to the cage.

2. The assembly of claim 1, wherein
    the first lock mechanism having a first arm that extends over the first rail;
    the second lock mechanism having a second arm that extends over the second rail;
    wherein the first device is secured to the cage when the first arm and the second arm extend over the first and second rails respectively.

3. The assembly of claim 1, wherein
    the first lock mechanism having a first ejector lever that applies extraction force to a bottom surface of the first edge of the first device; and
    the second lock mechanism having a second ejector lever that applies extraction force to a bottom surface of the second edge of the first device;

wherein the first device is slid out of the first and second slots when the first and second ejector levers apply extraction force to the bottom surfaces of the first and second edges of the first device.

4. The assembly of claim 1, wherein the first lock mechanism including a first handle; and the second lock mechanism including a second handle;

wherein the first and second handles are used to maneuver the first and second levers to slide the first device in and out of the first and second rails respectively.

5. The assembly of claim 1, wherein the processor retention assembly is positioned over a connector mounted onto a circuit board.

6. The assembly of claim 1, wherein the first wall having a third rail housing the first edge of a second edge finger connection device;

the second wall having a fourth rail housing the second edge of the second device;

a third lever pivotally coupled to the third rail, the third lever enables the first edge of the second device to slide in and out of the third rail; and a fourth lever pivotally coupled to the fourth rail, the second lever enables the second edge of the second device to slide in and out of the fourth rail.

7. The assembly of claim 1, wherein the first edge finger connection device is a processor.

8. A method for mounting an edge finger connection device into a connector, said method comprising the steps of:

(a) positioning a cage over the connector, the cage having a first wall and a second wall, the first wall having a first rail, the second wall having a second rail, the cage including a first lever and a second lever, the first lever pivotally mounted to the first rail and having a first arm, the second lever pivotally mounted to the second rail and having a second arm;

(b) placing a first edge of the edge finger connection device into the first rail;

(c) placing a second edge of the edge finger connection device into the second rail;

(d) sliding the edge finger connection device in a downward direction in the first and second rails;

(e) mounting the edge finger connection device into the connector;

(f) extending the first arm over the first rail; and (g) extending the second arm over the second rail.

9. The method of claim 8, comprising the steps of: before step (b), positioning the first arm so that the first arm does not extend over the first rail, and positioning the second arm so that the second arm does not extend over the second rail.

10. The method of claim 8, comprising the steps of:

providing a first ejector mechanism that is coupled to a bottom surface of the first lever;

providing a second ejector mechanism that is coupled to a bottom surface of the second lever;

using the first and second ejector mechanisms to apply extraction force to the bottom surface of the device; and removing the edge finger connection device from the cage.

11. The method of claim 8, comprising the steps of:

providing a third rail to the first wall;

providing a fourth rail to the second wall; and providing a third and fourth lever to the cage, the third lever pivotally mounted to the third rail and having a third arm, the fourth lever pivotally mounted to the fourth rail and having a fourth arm.

12. The method of claim 11, comprising the steps of:

placing a first edge of a second edge finger connection device into the third rail;

placing a second edge of the second edge finger connection device into the fourth rail;

sliding the second edge finger connection device in a downward direction in the third and fourth rails;

mounting the second edge finger connection device into the second connector; and securing the second edge finger connection device to the cage.

* * * * *